(12) United States Patent
Manabe

(10) Patent No.: US 7,932,140 B2
(45) Date of Patent: Apr. 26, 2011

(54) SEMICONDUCTOR DEVICE AND MANUFACTURING METHOD THEREOF

(75) Inventor: Kazutaka Manabe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 403 days.

(21) Appl. No.: 12/169,981

(22) Filed: Jul. 9, 2008

(65) Prior Publication Data

US 2009/0014793 A1    Jan. 15, 2009

(30) Foreign Application Priority Data

Jul. 11, 2007   (JP) ................. 2007-182359

(51) Int. Cl.
*H01L 21/338*  (2006.01)
*H01L 31/119*  (2006.01)
(52) U.S. Cl. ........................ 438/185; 257/408
(58) Field of Classification Search .......... 438/185, 438/371, 306, 527; 257/368, 408, E29.269–E29.279, 257/E21.435, E21.437
See application file for complete search history.

(56) References Cited

U.S. PATENT DOCUMENTS

| | | | | |
|---|---|---|---|---|
| 5,734,185 A | * | 3/1998 | Iguchi et al. ............... | 257/336 |
| 5,967,794 A | | 10/1999 | Kodama | |
| 6,137,149 A | * | 10/2000 | Kodama ..................... | 257/408 |
| 6,232,641 B1 | | 5/2001 | Miyano et al. | |
| 6,335,251 B2 | | 1/2002 | Miyano et al. | |
| 7,187,031 B2 | | 3/2007 | Azuma | |
| 2001/0023108 A1 | | 9/2001 | Miyano et al. | |

FOREIGN PATENT DOCUMENTS

| | | |
|---|---|---|
| JP | 10-050989 A | 2/1998 |
| JP | 2000-049348 A | 2/2000 |
| JP | 2004-006891 A | 1/2004 |

* cited by examiner

*Primary Examiner* — Calvin Lee
(74) *Attorney, Agent, or Firm* — Sughrue Mion, PLLC

(57) ABSTRACT

A semiconductor device includes: a semiconductor substrate; a pair of first diffusion layer regions provided near a top face of the semiconductor substrate; a channel region provided between the first diffusion layer regions of the semiconductor substrate; a gate insulation film provided on the channel region and on the semiconductor substrate such as to overlap with at least part of the first diffusion layer regions; a gate electrode provided on the insulation film; a pair of silicon selective growth layers provided on the semiconductor substrate at both sides of the gate electrode, each of the pair of silicon selective growth layers overlapping with at least part of the first diffusion layer regions, and being provided at a distance from the gate electrode; second diffusion layer regions provided in each of the silicon selective growth layers, peak positions of impurity concentration of the second diffusion layer regions being shallower than bottoms of the silicon selective growth layers; and third diffusion layer regions provided near side faces of the silicon selective growth layers, and electrically connecting the first diffusion layer regions to the second diffusion layer regions.

14 Claims, 8 Drawing Sheets

RELATED ART

RELATED ART

SEMICONDUCTOR DEVICE AND MANUFACTURING METHOD THEREOF

BACKGROUND OF THE INVENTION

1. Field of the Invention

The present invention relates to a semiconductor device including a MOS-type transistor and a manufacturing method thereof. The present invention particularly relates to a semiconductor including a MOS-type transistor in which silicon selective growth layers including impurity diffusion layers are provided in a step-like (elevated) shape on both sides of a gate electrode, and a manufacturing method thereof.

Priority is claimed on Japanese Patent Application No. 2007-182359, filed Jul. 11, 2007, the content of which is incorporated herein by reference.

2. Description of Related Art

In MOS-type transistors, the short channel effect must be suppressed to achieve miniaturization, i.e. to shorten the gate length. To reduce the junction depth of the source and drain regions (depth from the substrate surface) and suppress reduction of the on-current, resistance must be suppressed.

To meet such demands, a transistor with an elevated source/drain structure, in which a step-like (elevated) silicon selective growth layer is provided in a source region and a drain region of a silicon substrate, is proposed (e.g. Japanese Unexamined Patent Application, First Publication No. H 10-50989, Japanese Unexamined Patent Application, First Publication No. 2000-49348, Japanese Unexamined Patent Application, First Publication No. 2004-6891). In such transistors, when fabricating the source region and the drain region, ions are implanted from a top face of the silicon selective growth layer. This enables the source and drain regions to be fabricated thinner by the same thickness as the silicon selective growth layer, while utilizing conventional ion-implantation conditions. A transistor in which short channel effect is unlikely to arise can thus be obtained. It also becomes possible to fabricate source and drain regions in a diffusion layer region of higher concentration, thereby reducing the parasite resistance and increasing the on-current.

FIG. 14 is an example of a transistor with an elevated source/drain structure of related art. The transistor in FIG. 14 is an n-channel transistor that uses electrons as carriers. In this transistor, a gate electrode 103 is formed over a p-type silicon substrate 101, with a gate insulation film 102 therebetween. An upper gate insulation film 104 is provided on a top face of the gate electrode 103. Side walls 105 made of insulation film are formed at side faces of the gate electrode 103.

Diffusion layer regions including first diffusion layer regions 106a and 106b to fourth diffusion layer regions 109a and 109b are provided respectively at both side faces of gate electrode formation regions (regions corresponding to gate electrodes) of the silicon substrate 101. The first diffusion layer regions 106a and 106b are n-type impurity diffusion layers, provided in regions that correspond to the side walls 105 of the silicon substrate 101. The first diffusion layer regions 106a and 106b function as extension regions that constitute a lightly doped drain (LDD) structure. In this transistor, a region between these first diffusion layer regions 106a and 106b becomes a channel region 110 which carriers flow through.

The fourth diffusion layer regions 109a and 109b are p-type impurity diffusion layers, provided around the first diffusion layer regions 106a and 106b and third diffusion layer regions 108a and 108b of the silicon substrate 101. The fourth diffusion layer regions 109a and 109b function as halo regions that prevent punch-through and the like. Step-like (elevated) silicon selective growth layers 110a and 110b are fabricated by selective epitaxial (EPI) growth on both sides of the gate electrode 103 (at regions corresponding to the third diffusion layer regions 108a and 108b) on the silicon substrate 101.

Second diffusion layer regions 107a and 107b are provided in approximately the whole of the silicon selective growth layers 110a and 110b. The second diffusion layer regions 107a and 107b are n-type impurity diffusion layers, and are electrically connected at underside edges to the first diffusion layer regions 106a and 106b of the same conductive type. The third diffusion layer regions 108a and 108b are provided in regions corresponding respectively to the silicon selective growth layers 110a and 110b of the silicon substrate 101. The third diffusion layer regions 108a and 108b are formed by diffusing the n-type impurities doped in the silicon selective growth layers 110a and 110b into the silicon substrate 101.

FIG. 15 is an impurity concentration profile of this transistor taken along a line A3-A4 in FIG. 14. In FIG. 15, the horizontal axis represents distance from the top faces of the silicon selective growth layers 110a and 110b, and the vertical axis represents the impurity concentration. A position R1 of the silicon selective growth layer 110b and a position R2 of the top face of the silicon substrate 101 are shown on the horizontal axis of FIG. 15. FIG. 15 indicates the impurity concentration S1 of the first diffusion layer (n⁻ layer extension) region 106b, the impurity concentration S2 of the second diffusion layer (n⁺ layer) region 107b, the impurity concentration S3 of the third diffusion layer region 108b, and impurity concentration S4 of the fourth diffusion layer (p-type Halo) region 109b. Thus in this transistor, the impurity concentration S1 of the first diffusion layer regions 106a and 106b is lower than the impurity concentration S2 of the second diffusion layer regions 107a and 107b, and the impurity concentration S3 of the third diffusion layer regions 108a and 108b. The first diffusion layer regions 106a and 106b, the second diffusion layer regions 107a and 107b, and the third diffusion layer regions 108a and 108b constitute an LDD structure. That is, the second diffusion layer region 107a and the third diffusion layer region 108a, and the second diffusion layer region 107b and the third diffusion layer region 108b, which have high impurity concentration, respectively function as a source and a drain. The fourth diffusion layer regions 109a and 109b, which have low impurity concentration, function as extension regions.

The third diffusion layer regions 108a and 108b, which constitute a source and a drain, are formed by diffusion of n-type impurities doped in the silicon selective growth layers 110a and 110b into the silicon substrate 101. This enables the thickness (effective junction depth) of the third diffusion layer regions 108a and 108b to be thin. This transistor is therefore unlikely to suffer short channel effect Also, since the source and drain are constituted by the second diffusion layer regions 107a and 107b and the third diffusion layer regions 108a and 108b, their thicknesses become the total thicknesses of these diffusion layer regions, enabling resistance to be suppressed.

In this transistor, to achieve a reliable electrical connection between the first diffusion layer regions 106a and 106b and the second diffusion layer regions 107a and 107b, the impurity concentration of the portions of the second diffusion layer regions 107a and 107b that contact to the silicon substrate 101 (impurity concentration at point B in FIG. 15) must be high. However, when the impurity concentration at point B is high, more impurities are diffused to the silicon substrate 101, increasing the depth of the third diffusion layer regions 108a and 108b.

In miniaturizing the transistor, the side walls 105 provided on the side walls of the gate electrode 103 also becomes thinner. Consequently, the distance between the third diffusion layer region 108a and the third diffusion layer region 108b tends to decrease. In this circumstance, if the third diffusion layer regions 108a and 108b are fabricated to a deep position from the top face of the silicon substrate 101, short channel effect is likely to happen. This makes it difficult to shorten the gate length, i.e. to miniaturize the transistor. For this reason, the third diffusion layer regions 108a and 108b are generally designed to be fabricated at the minimum depth required for electrical connection between the first diffusion layer regions 106a and 106b and the second diffusion layer regions 107a and 107b.

However, the fourth diffusion layer regions 109a and 109b of the reverse-conductive type p-type) are generally provided below the first diffusion layer regions 106a and 106b and the third diffusion layer regions 108a and 108b. Therefore, if it is attempted to make the depth of the third diffusion layer regions 108a and 108b as shallow as possible, the p-type impurity in the fourth diffusion layer regions 109a and 109b cannot be repelled by the reverse-conductive impurity in the third diffusion layer regions 108a and 108b, leading to a high p-type impurity concentration at the interfaces between the fourth diffusion layer regions 109a and 109b and the third diffusion layer regions 108a and 108b. As a result, as indicated at point C in FIG. 15, a high-concentration pn junction is formed between the third diffusion layer regions 108a and 108b and the fourth diffusion layer regions 109a and 109b, and the junction capacity in the diffusion layer region greatly increases. This leads to a problem of signal delay in the circuit.

Due to the nature of fabricating diffusion layer regions, the size of the first diffusion layer regions 106a and 106b is determined by the width of the side walls 105. As already mentioned, when the side walls 105 become narrower as the transistor is miniaturized, the first diffusion layer regions 106a and 106b also become smaller. This lessens the effect of by the LDD structure, namely the electric field relaxation effect. This leads to a problem of reduced hot carrier (HC) immunity.

SUMMARY

The present invention seeks to solve one or more of the above problems, or to improve upon those problems at least in part.

In one embodiment, there is provided a semiconductor device that includes: a semiconductor substrate; a pair of first diffusion layer regions provided near a top face of the semiconductor substrate; a channel region provided between the first diffusion layer regions of the semiconductor substrate; a gate insulation film provided on the channel region and on the semiconductor substrate such as to overlap with at least part of the first diffusion layer regions; a gate electrode provided on the insulation film; a pair of silicon selective growth layers provided on the semiconductor substrate at both sides of the gate electrode, each of the pair of silicon selective growth layers overlapping with at least part of the first diffusion layer regions, and being provided at a distance from the gate electrode; second diffusion layer regions provided in each of the silicon selective growth layers, peak positions of impurity concentration of the second diffusion layer regions being shallower than bottoms of the silicon selective growth layers; and third diffusion layer regions provided near side faces of the silicon selective growth layers, and electrically connecting the first diffusion layer regions to the second diffusion layer regions.

In another embodiment, there is provided a semiconductor device manufacturing method that includes: forming first diffusion layer regions at a semiconductor substrate on which a gate electrode provided with a gate insulation film and an upper gate insulation film are formed, in regions corresponding to both sides of the gate electrode; forming side walls on side faces of the gate electrode; forming step-like silicon selective growth layers on the semiconductor substrate at both sides of the gate electrode such that the silicon selective growth layers are adjacent to the side walls; forming second diffusion layer regions having a same conductive type as the first diffusion layer regions at top faces of the silicon selective growth layers, such that at least peak positions of impurity concentrations of the second diffusion layer regions are shallower than bottoms of the silicon selective growth layers; removing at least part of the side walls to form gap sections along side faces of the silicon selective growth layers; and forming third diffusion layer regions having a same conductive type as the first and second diffusion layer regions near side faces of the silicon selective growth layers, via the gap sections.

In the semiconductor device, first diffusion layer regions provided at respective sides of a gate electrode formation region of the semiconductor substrate function as extension regions of LDD structure. Second diffusion layer regions function as a source and a drain of the LDD structure. Third diffusion layer regions have a function of electrically connecting the first diffusion layer regions to the second diffusion layer regions.

According to the semiconductor device, the distance between the second diffusion layer regions which function as a source and a drain and the edge of the gate electrode can be made wider than the side wall formed in the manufacturing process, irrespective of the width of the side wall. Therefore, even when the width of the side wall is reduced to miniaturize the transistor, a sufficient distance between the source and the drain can be maintained. This makes short channel effect unlikely. Therefore, the gate length can easily be made shorter, which is effective in miniaturizing the transistor.

Further, according to the semiconductor device, the distance between the source and drain (second diffusion layer regions) and the edge of the gate electrode can be made wider. This can relax the electric field near the drain, and obtain excellent HC immunity.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
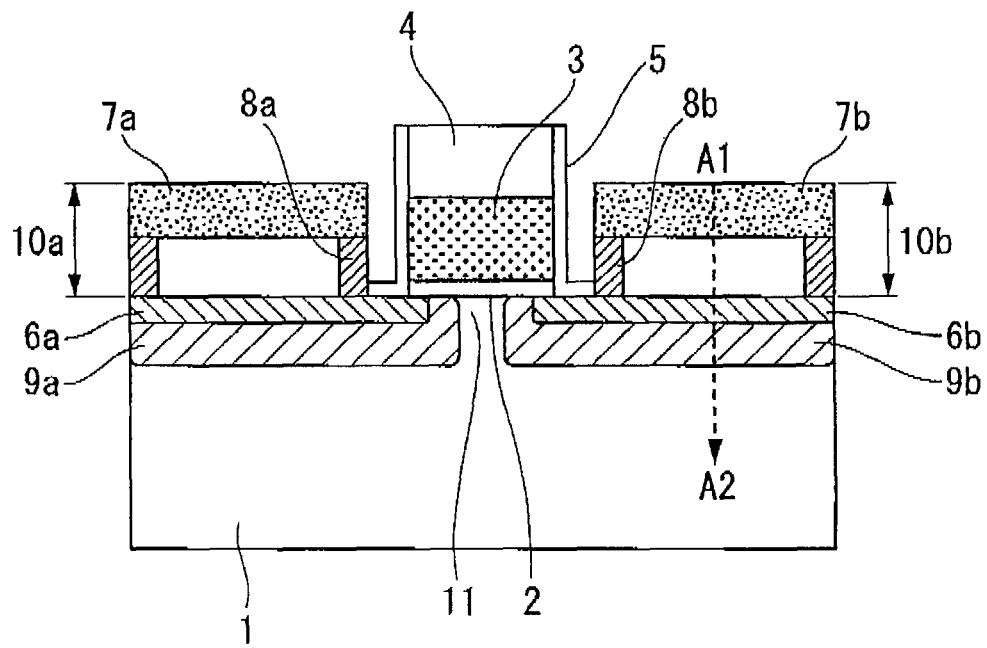
FIG. 1 is a vertical cross-sectional view of a semiconductor device according to a first embodiment.

A semiconductor device according to a first embodiment of the invention will be explained. This example describes a negative metal oxide semiconductor (nMOS) transistor. FIG. 1 is a vertical cross-sectional view of a semiconductor device according to a first embodiment.

In FIG. 1, a semiconductor substrate 1 is obtained by adding, for example, p-type impurities (such as boron) to a semiconductor at a predetermined concentration, and is fabricated from, for example, silicon. On a top face of the semiconductor substrate 1, an element isolation region (not shown) for insulating and isolating a transistor is formed in a portion other than a transistor formation region.

A lower gate insulation film 2 of silicon oxide film is formed by thermal oxidation and the like in a predetermined region (gate electrode formation region) of the transistor formation region. A gate electrode 3 is provided by forming, for example, a polycrystalline silicon layer on the lower gate insulation film 2. A phosphorous-doped polycrystalline silicon layer formed by introducing impurities during CVD growth can be used as the polycrystalline silicon layer. An upper gate insulation film 4 of such as silicon oxide film is formed on the gate electrode 3. A first side wall film 5 made from an insulation film such as silicon oxide film is formed on side walls of the gate electrode 3.

Silicon selective growth layers 10a and 10b are provided in a step-like (elevated) shape on the top face of the semiconductor substrate 1 which is not covered by the gate electrode 3, the first side wall film 5, etc. Side faces of the silicon selective growth layers 10a and 10b are separated from the side walls of the first side wall film 5. A gap section is provided between the silicon selective growth layers 10a and 10b and the first side wall film 5, and has approximately the same width as that of a second side wall film 12 described below.

First diffusion layer regions 6a and 6b are provided at the top face of the semiconductor substrate 1 on both sides of the gate electrode 3. Second diffusion layer regions 7a and 7b are provided in top faces of the silicon selective growth layers 10a and 10b. Third diffusion layer regions 8a and 8b are provided in side faces of the silicon selective growth layers 10a and 10b. The third diffusion layer regions 8a and 8b electrically connect the first diffusion layer regions 6a and 6b to the second diffusion layer regions 7a and 7b. Fourth diffusion layer regions 9a and 9b are provided around the first diffusion layer regions 6a and 6b. A region of semiconductor substrate between the first diffusion layer regions 6a and 6b becomes a channel region 11 which carriers flow through. The first diffusion layer regions 6a and 6, the second diffusion layer regions 7a and 7b, and the third diffusion layer regions 8a and 8b are n-type impurity diffusion layers. The first diffusion layer regions 6a and 6b function as extension regions that constitute a lightly doped drain (LDD) structure. Therefore, the impurity concentration of the first diffusion layer regions 6a and 6b is preferably lower than that of the second diffusion layer regions 7a and 7b and the third diffusion layer regions 8a and 8b.

The fourth diffusion layer regions 9a and 9b provided around the first diffusion layer regions 6a and 6b are p-type impurity diffusion layers, and function as halo regions that prevent punch-through and the like. As a conventional setting selection, halo regions are not always required. If they are not required, the fourth diffusion layer regions 9a and 9b need not be provided.

It is general to form a halo region for a transistor aimed at miniaturization. When providing the fourth diffusion layer regions 9a and 9b as halo regions, the first diffusion layer regions 6a and 6b form a pn junction with the fourth diffusion layer regions 9a and 9b. Since the impurity concentration of the first diffusion layer regions 6a and 6b is lower than the impurity concentration of the second diffusion layer regions 7a and 7b, junction capacity at the pn junction can be kept low, and signal delay in the circuit where the pn junction is formed can be reduced.

Figure 2:
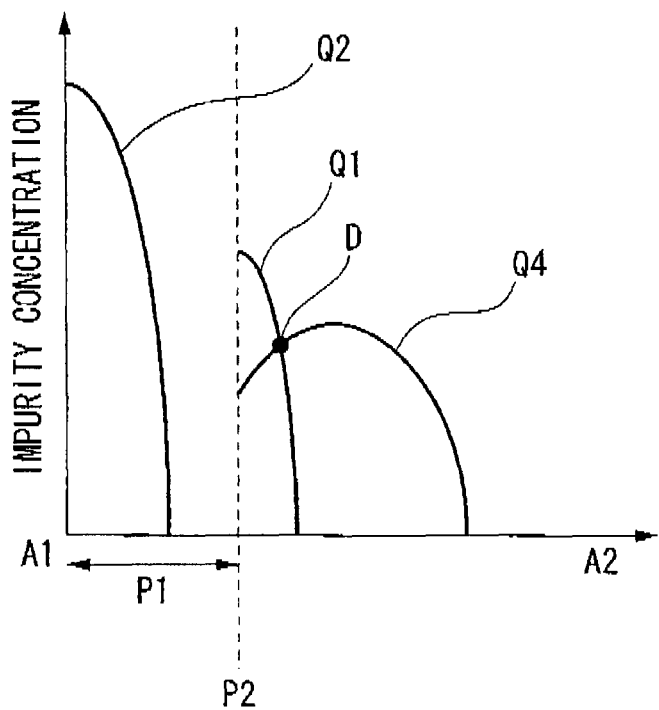
FIG. 2 is a schematic view of one example of an impurity concentration profile taken along a line A1-A2 of FIG. 1, in the semiconductor device according to the first embodiment.

In FIG. 1, the entire second diffusion layer regions 7a and 7b are at shallower positions than the bottoms of the silicon selective growth layers 10a and 10b. This positional relationship is preferable for obtaining advantages of suppressing the short-channel effect and reducing junction capacity. However, even if the concentration distribution end portions of the second diffusion layer regions 7a and 7b are at deeper positions than the bottoms of the silicon selective growth layers 10a and 10b, those advantages are not completely lost. Therefore, the impurity concentration peak positions of the second diffusion layer regions 7a and 7b can be set at shallower positions than the bottoms of the silicon selective growth layers 10a and 10b. Preferably, the third diffusion layer regions 8a and 8b for electrically connecting the first diffusion layer regions 6a and 6b to the second diffusion layer regions 7a and 7b are wide enough to allow that electrical connection, and are set as shallow and as high-concentration as possible. In FIG. 1, due to this positional relationship of the diffusion layers, regions surrounded by first, second, and third diffusion layer regions in the silicon selective growth layers 10a and 10b do not actually contain impurities. FIG. 2 is one example of an impurity concentration profile of these diffusion regions taken along a line A1-A2 in FIG. 1. In FIG. 2, the horizontal axis represents distance from top faces of the silicon selective growth layers 10a and 10b, and the vertical axis represents impurity concentration. A position P1 of a selective EPI growth silicon 10b and a position P2 of the top face of the silicon substrate 1 are shown on the horizontal axis of FIG. 2. FIG. 2 illustrates an impurity concentration Q1 of the first diffusion layer (n layer extension) region 6b, an impurity concentration Q2 of the second diffusion layer (n+layer) region 7b, and an impurity concentration Q4 of the fourth diffusion layer (p-typo Halo) region 9b.

Although not shown in FIG. 1, there are also provided conventional interlayer insulation films, contacts penetrating through the interlayer insulation films, wirings, and so on, which are generally required in fabricating a semiconductor device.

The thickness of the silicon selective growth layers 10a and 10b can be selected from a range of, for example, 20 nm to 300 nm; a film thickness of approximately 100 nm can be selected as one example. While the impurity concentration of the third diffusion layer regions 8a and 8b can be selected relatively, such that it is between the densities of the first diffusion layer regions 6a and 6b and the second diffusion layer regions 7a and 7b, it is not limited to this range. The impurity concentration of the third diffusion layer regions 8a and 8b can be selected from an approximate range of, for example, $5 \times 10^{18}$ to $1 \times 10^{21}/cm^3$; as one example, $8 \times 10^{19}$ can be selected.

The depth of the third diffusion layer regions 8a and 8b can be selected from between, for example, approximately 10 to 80 nm.

A first manufacturing method of a semiconductor device according to a first embodiment of the invention will be explained, taking as an example the manufacturing of the semiconductor device shown in FIG. 1.

FIGS. 3 to 6 are explanatory diagrams of a first manufacturing method of a semiconductor device.

{Step 1}

As a semiconductor substrate 1, for example, a p-type silicon substrate is prepared, and an element isolation region (not shown) is formed by shallow trench isolation (STI) at a top face of his substrate. Thermal oxidation is then performed to form a gate insulation film of silicon oxide film having a thickness of, for example, 3 nm on the top face of the semiconductor substrate 1.

Figure 3:
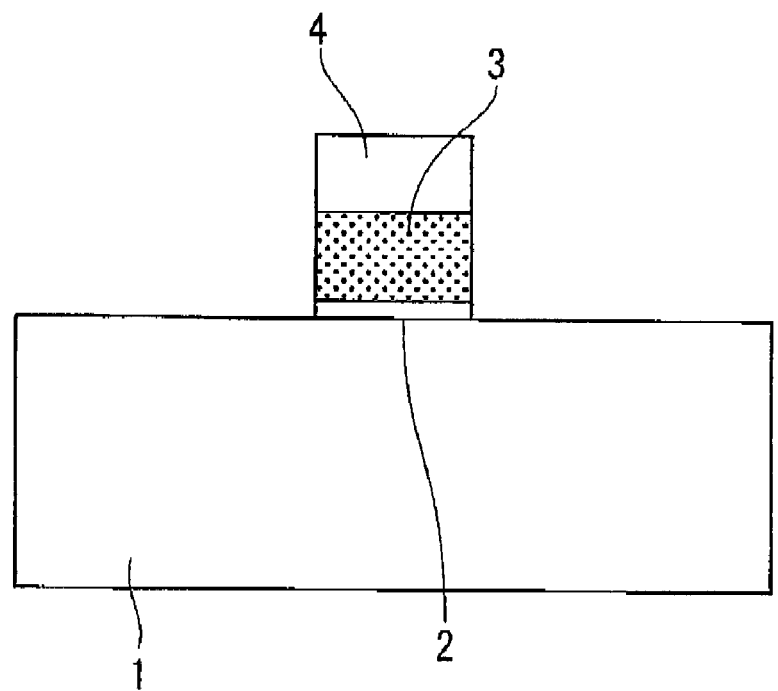
FIG. 3 is a vertical cross-sectional view of a step sequence in a manufacturing method of the semiconductor device according to the first embodiment, and illustrates steps of forming a lower gate insulation film, a gate electrode, and an upper gate insulation film.

A phosphorous-doped silicon film as an example and a upper gate insulation film of a silicon oxide film having a thickness of, for example, 70 nm, are grown sequentially over the gate insulation film. This phosphorous-doped silicon film has a thickness of, for example, 100 nm, and its impurity concentration is $1 \times 10^{20}/cm^3$. Each film is then patterned to a desired pattern, using techniques such as lithography and etching. The gate insulation film 2, the gate electrode 3, and the upper gate insulation film 4 are thus formed as shown in FIG. 3.

{Step 2}

Figure 4:
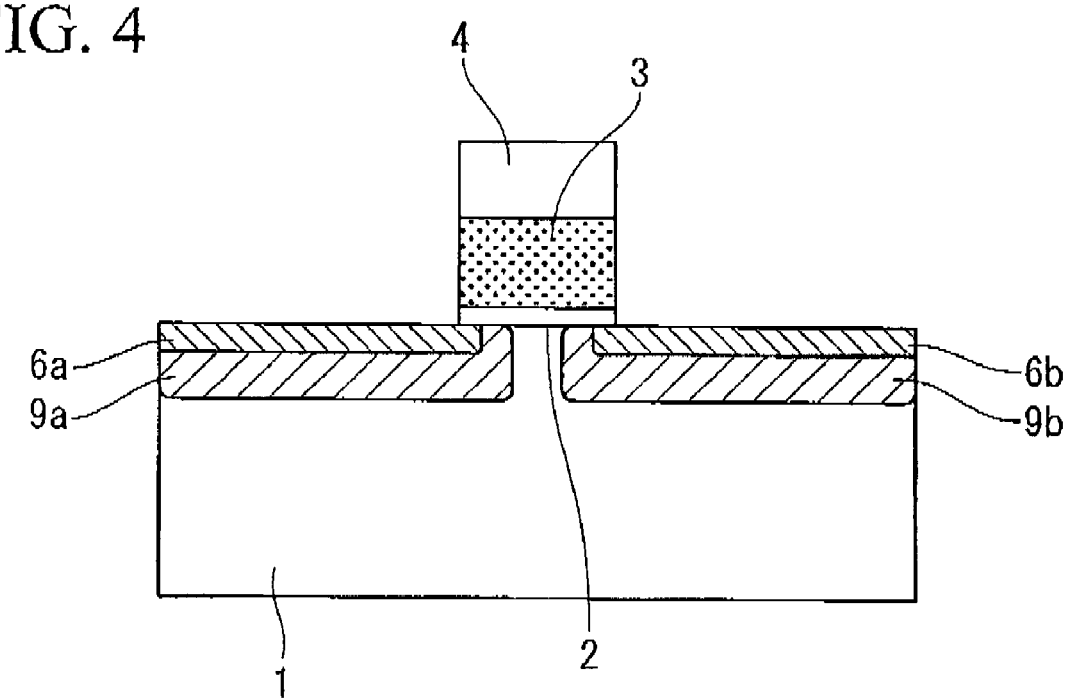
FIG. 4 is a vertical cross-sectional view of a step sequence in the manufacturing method of the semiconductor device according to the first embodiment, and illustrates steps of forming first diffusion layer regions and fourth diffusion layer regions.

Subsequently, for example, arsenic is introduced into the semiconductor substrate 1 by ion implantation. The conditions for ion implantation are, for example, acceleration energy of 10 keV and a dosage of $1 \times 10^{14}/cm^2$. As shown in FIG. 4, this forms first diffusion layer regions (n⁻ impurity diffusion layers) 6a and 6b on both sides of a region corresponding to the gate electrode 3. The first diffusion layer regions 6a and 6b function as extension regions of an nMOS transistor.

{Step 3}

Subsequently, for example, boron is introduced into the semiconductor substrate 1 by ion implantation. The conditions for this ion implantation are, for example, acceleration energy of 10 keV and a dosage of $1 \times 10^{13}/cm^2$. As shown in FIG. 4, this forms fourth diffusion layer regions (p-type impurity diffusion layers) 9a and 9b in surrounding regions beneath the first diffusion layer regions 6a and 6b. The fourth diffusion layer regions 9a and 9b function as Halo regions of the nMOS transistor.

{Step 4}

Figure 5:
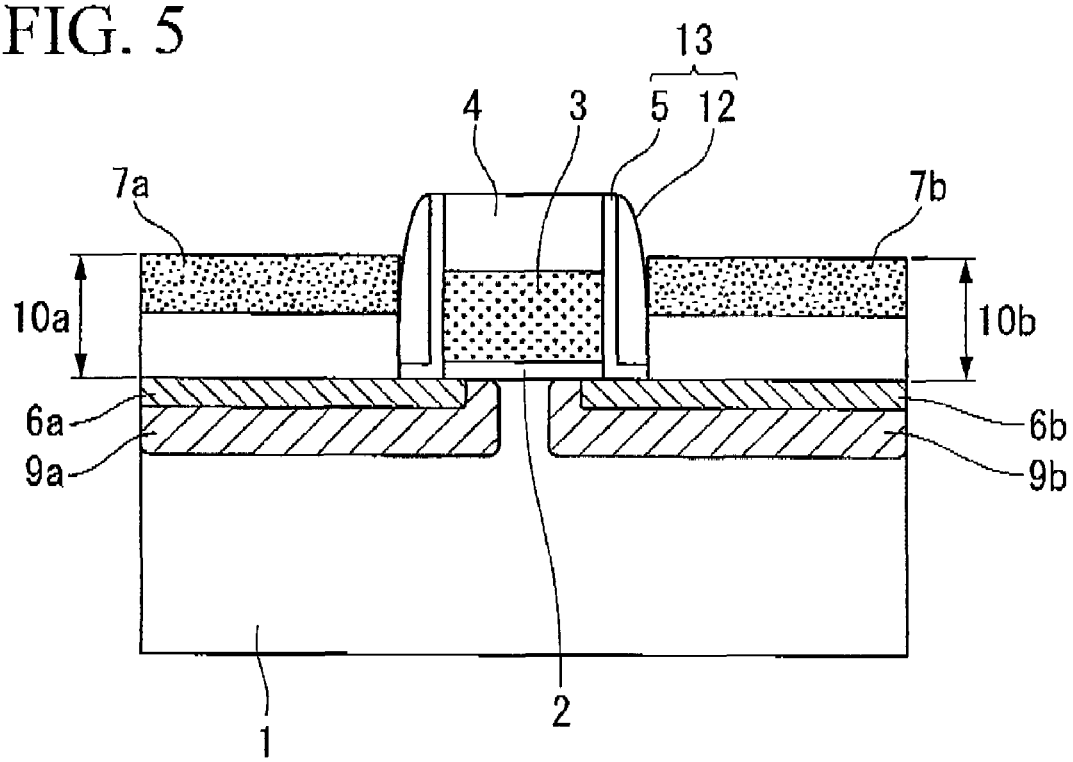
FIG. 5 is a vertical cross-sectional view of a step sequence in the manufacturing method of the semiconductor device according to the first embodiment, and illustrates steps of forming second diffusion layer regions.

Subsequently, for example, a silicon oxide film having a thickness of 8 nm and a silicon nitride film having a thickness of 20 nm are grown on the semiconductor substrate 1 such as to cover the gate insulation film 2, the gate electrode 3, and the upper gate insulation film 4. The silicon oxide film and the silicon nitride film are then processed by etching back. As shown in FIG. 5, a side wall spacer (side wall) 13 including a first side wall film 5 and a second side wall film 12 is thereby formed on side walls of the gate electrode 3 and the upper gate insulation film 4. The silicon oxide film can be formed by thermal oxidation of side faces of the gate electrode 3 before forming the first diffusion layer regions 6a and 6b and the fourth diffusion layer regions 9a and 9b.

{Step 5}

Subsequently, silicon selective growth layers 10a and 10b with a thickness of, for example, 100 nm are selectively formed on an exposed top face of the semiconductor substrate 1, using selective epitaxial growth.

{Step 6}

Subsequently, for example, boron is introduced into the silicon selective growth layers 10a and 10b by ion implantation. The conditions for ion implantation are, for example, acceleration energy of 10 keV and a dosage of $1 \times 10^{15}/cm^2$. As shown in FIG. 5, his forms second diffusion layer regions (n⁺ impurity diffusion layers) 7a and 7b. The second diffusion layer regions 7a and 7b function as a source region and a drain region of the nMOS transistor. Ion implantation to form the second diffusion layer regions 7a and 7b is preferably performed under conditions (e.g. the abovementioned conditions) such that the n-type impurity is diffused only in portions near the top face of the silicon selective growth layers 10a and 10b, and does not reach the top face of the semiconductor substrate 1.

{Step 7}

Figure 6:
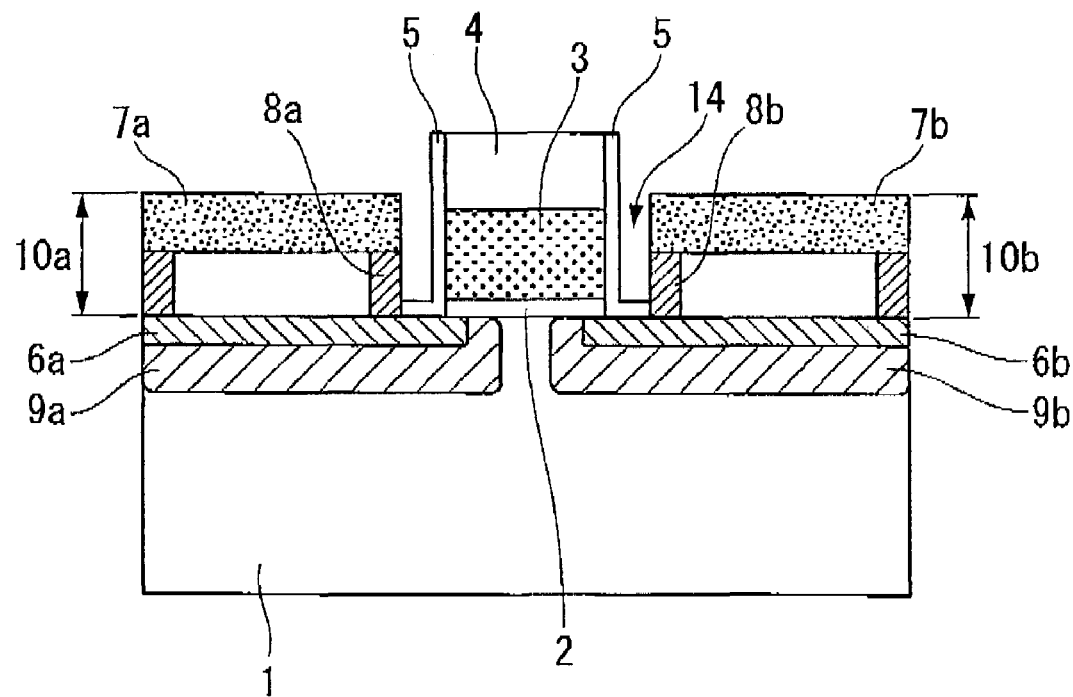
FIG. 6 is a vertical cross-sectional view of a step sequence in the manufacturing method of the semiconductor device according to the first embodiment, and illustrates steps of forming third diffusion layer regions.

Subsequently, the second side wall film 12 is removed by, for example, wet etching using phosphoric acid. As shown in FIG. 6, this forms a gap section 14 between the first side wall film 5 and the silicon selective growth layers 10a and 10b.

{Step 8}

Subsequently, using the gap section 14, boron or phosphorous is introduced to top faces and side faces of the silicon selective growth layers 10a and 10b using plasma doping such that the impurity concentration at the side faces is, for example, $1 \times 10^{19}/cm^3$. As shown in FIG. 6, this forms third diffusion layer regions (n impurity diffusion layers) 8a and 8b near side faces of the silicon selective growth layers 10a and 10b. Impurities are introduced onto the top face in this step, and this region overlaps with the second diffusion layer regions 7a and 7b. For simplicity, therefore, it will not be explained. Only the diffusion layer regions on side faces of the silicon selective growth layers 10a and 10b are deemed as the third diffusion layer regions 8a and 8b.

In addition to plasma doping, another method, such as rotation-tilt ion implantation, can be used to form the third diffusion layer regions 8a and 8b. Nonetheless, use of plasma doping is preferable when the gap section 14 between the first side wall film 5 and the silicon selective growth layers 10a and 10b is small due to miniaturization, when the vertical cross-sectional shape of the silicon selective growth layers 10a and 10b is an overhang, and other such cases. After forming the diffusion layer regions in this manner, interlayer films, contact plugs, wirings and the like are fabricated to obtain a semiconductor device. Thermal processing is performed as appropriate, e.g. activate thermal processing, and thermal processing after interlayer film formation.

Second Embodiment

Figure 7:
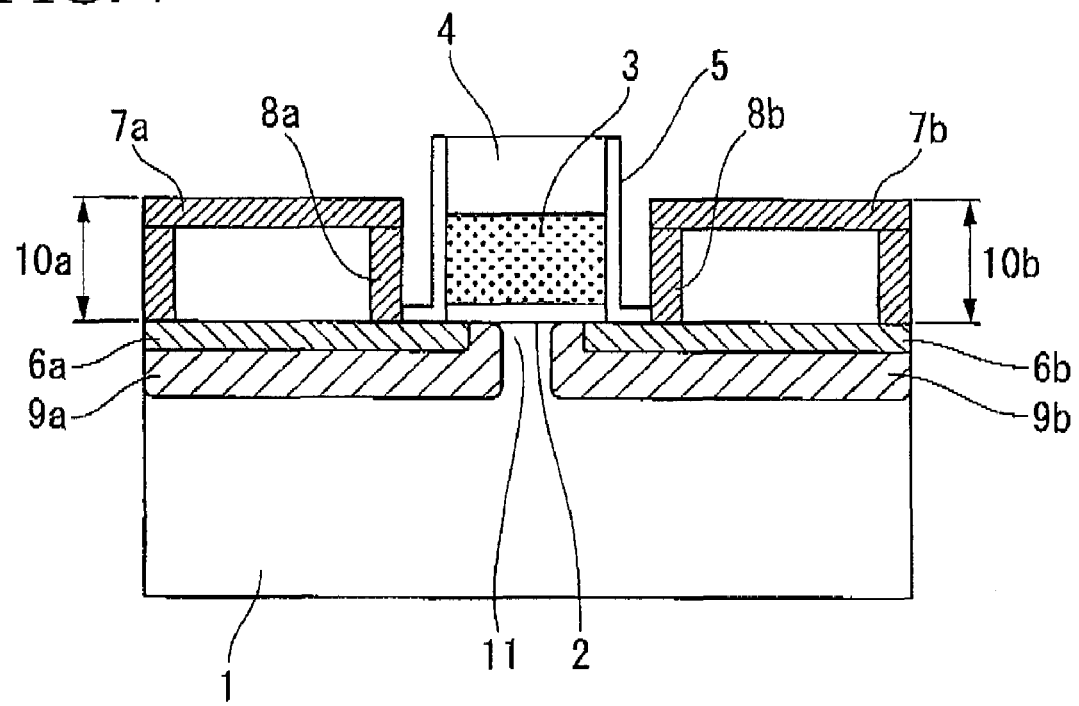
FIG. 7 is a vertical cross-sectional view of a semiconductor device according to a second embodiment.

A semiconductor device according to a second embodiment of the invention will be explained. In a second embodiment, constituent parts that are similar to those in the first embodiment will not be explained. FIG. 7 is a vertical cross-sectional view of a semiconductor device in a second embodiment.

The semiconductor device of the second embodiment is similar to the semiconductor device of the first embodiment except that second diffusion layer regions 7a and 7b are formed at the same time as third diffusion layer regions 8a and 8b.

In the semiconductor device of the second embodiment, {Step 6} described above is omitted by introducing impurities into the silicon selective growth layers 10a and 10b during {Step 8} described above. To simplify explanation, of the impurity diffusion layers at side faces and top faces of the silicon selective growth layers 10a and 10b formed in this {Step 8}, only top face parts are made into second diffusion layer regions 7a and 7b. Therefore, the number of steps in the second embodiment can be made fewer than in the first embodiment, enabling the manufacturing cost to be reduced.

Third Embodiment

Figure 8:
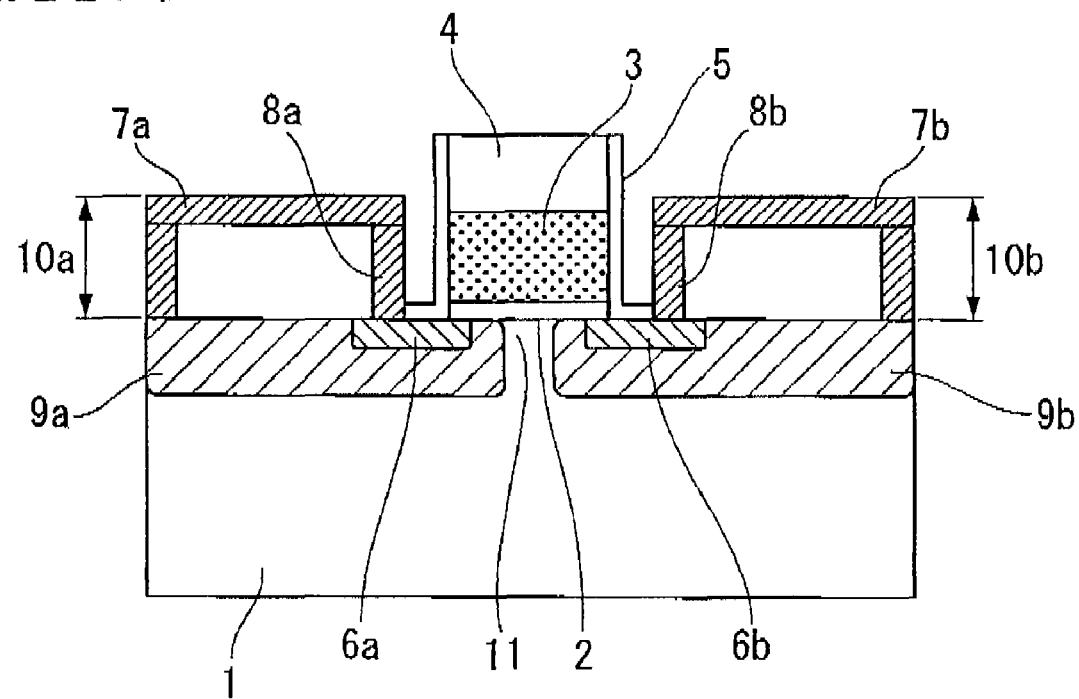
FIG. 8 is a vertical cross-sectional view of a semiconductor device according to a third embodiment.

A semiconductor device according to a third embodiment of the invention will be explained. In the third embodiment, constituent parts that are similar to those in the first and second embodiments will not be repetitiously explained. FIG. 8 is a vertical cross-sectional view of a semiconductor device in a third embodiment.

A feature of the semiconductor device of the third embodiment, in comparison with the second embodiment, is that the first disunion layer regions 6a and 6b are provided only near the bottom of the first side wall film. Although not shown in the drawings, the first diffusion layer regions 6a and 6b can also be similarly arranged in the semiconductor device of the first embodiment.

Figure 9:
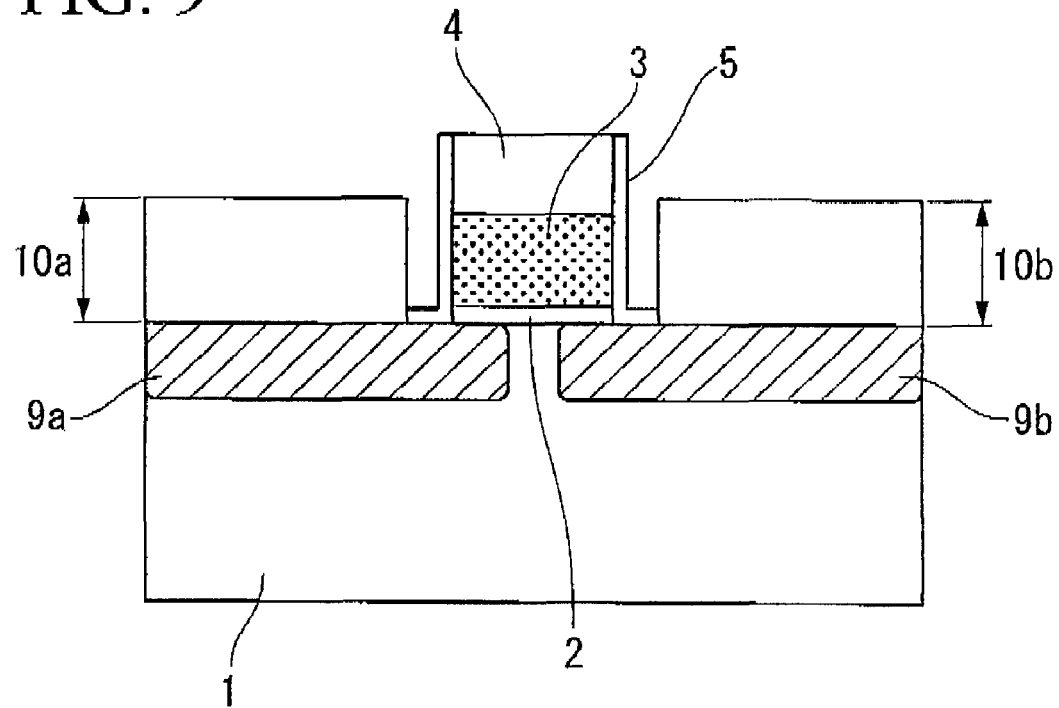
FIG. 9 is a vertical cross-sectional view of a step sequence in a manufacturing method of the semiconductor device according to the third embodiment, and illustrates a state before formation of first to third diffusion layer regions.

To manufacture the semiconductor device of the third embodiment, the steps of manufacturing the semiconductor device of the second embodiment are modified as follows. {Step 2} described in the steps of manufacturing the semiconductor device of the second embodiment is omitted. Instead, during the stage where the gap section 14 exists between the first side wall film 5 and the silicon selective growth layers 10a and 10b as described in {Step 7} (e.g. the stage shown in FIG. 9), boron is introduced through the first side wall film 5 by ion implantation with an acceleration energy of for example, 10 to 25 keV. This forms the first diffusion layer regions 6a and 6b shown in FIG. 8. The semiconductor device of the third embodiment is thus manufactured.

Impurities are also introduced by ion implantation to the top faces of the silicon selective growth layers 10a and 10b, and this region overlaps with the second diffusion layer regions 7a and 7b. Therefore, for simplicity of explanation, only regions near the bottom of the first side wall film are made into first diffusion layer regions 6a and 6b.

In the third embodiment in particular, it is possible to reduce the area of the pn junction formed by the first diffusion layer regions 6a and 6b and the fourth diffusion layer regions 9a and 9b. The pn junction capacity can thereby be further reduced, and so can circuit signal delay.

Fourth Embodiment

A semiconductor device according to a fourth embodiment of the invention will be explained. In the fourth embodiment, constituent parts that are similar to those in the first to third embodiments will not be repetitiously explained.

Figure 10:
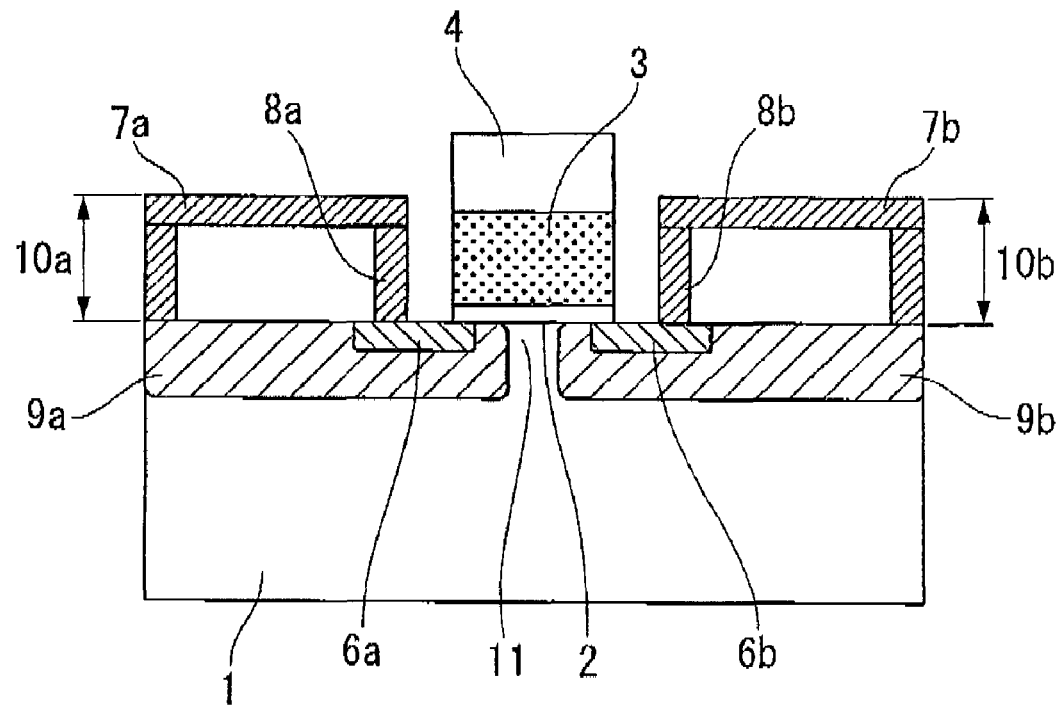
FIG. 10 is a vertical cross-sectional view of a semiconductor device according to a fourth embodiment.
Figure 11:
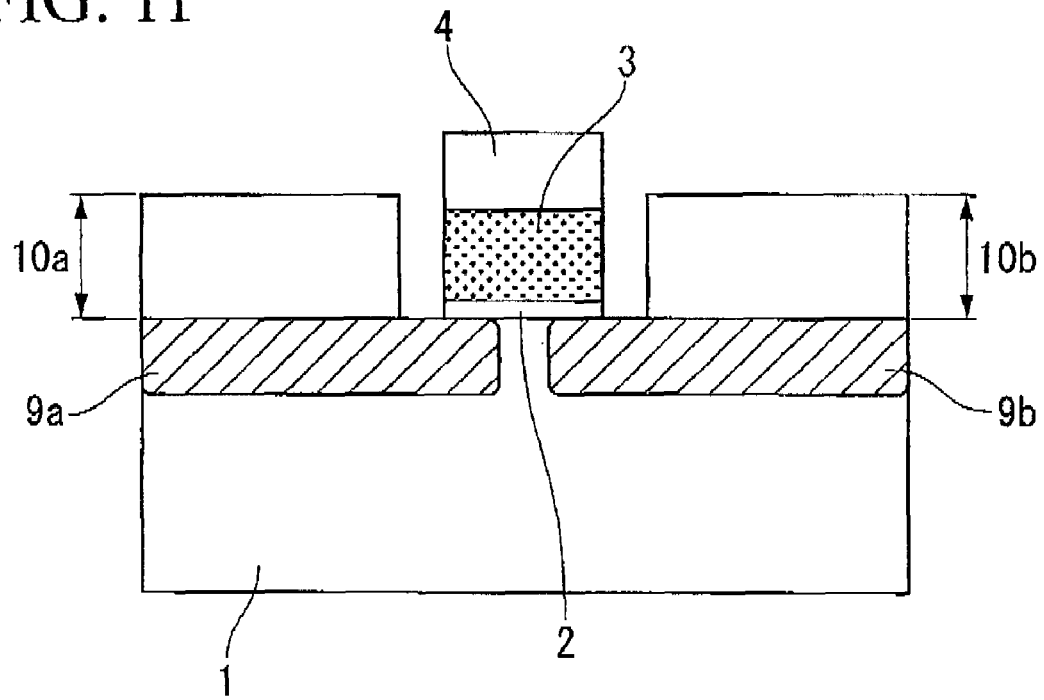
FIG. 11 is a vertical cross-sectional view of a step sequence in a manufacturing method of a semiconductor device according to a fourth embodiment, and illustrates a state before formation of first to third diffusion layer regions.

FIG. 10 is a vertical cross-sectional view of a semiconductor device in a fourth embodiment.

In comparison with the third embodiment, the semiconductor device of the fourth embodiment has the following features. The first side wall film 5 is removed. The first diffusion layer regions 6a and 6b are formed in the same ion implantation step as the second diffusion layer regions 7a and 7b and the third diffusion layer regions 8a and 8b.

Steps of manufacturing the semiconductor device of the fourth embodiment modify the steps of manufacturing the semiconductor device of the third embodiment as follows. The step of forming the first diffusion layer regions 6a and 6b by ion implantation in the third embodiment is omitted. Also, in the stage shown in FIG. 9, {Step 8} is performed after removing the first side wall film 5 by wet etching. Thus the semiconductor device of the fourth embodiment can be manufactured.

Fifth Embodiment

A semiconductor device according to a fifth embodiment of the invention will be explained. In the fifth embodiment, constituent parts that are similar to those in the first to fourth embodiments will not be repetitiously explained.

Figure 12:
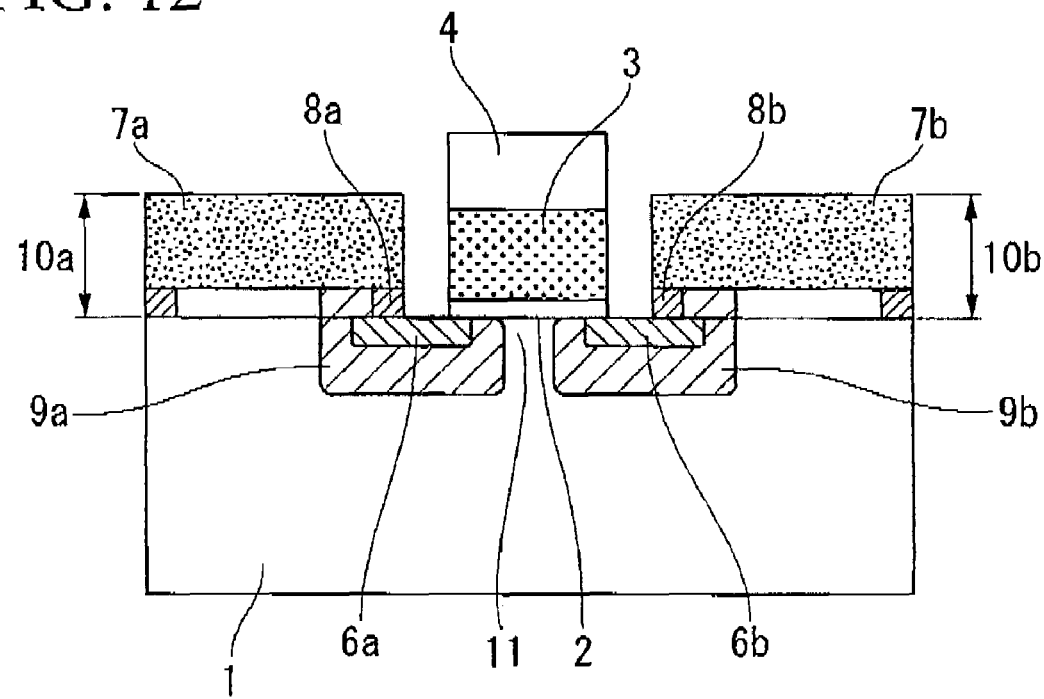
FIG. 12 is a vertical cross-sectional view of a semiconductor device according to a fifth embodiment.

FIG. 12 is a vertical cross-sectional view of a semiconductor device in a fifth embodiment.

In comparison with the fourth embodiment, the semiconductor device of the fifth embodiment has the follow features. The fourth diffusion layer regions 9a and 9b exist only near both sides of the gate electrode 3. Another feature is that the second diffusion layer regions 7a and 7b described in the first embodiment are employed.

Figure 13:
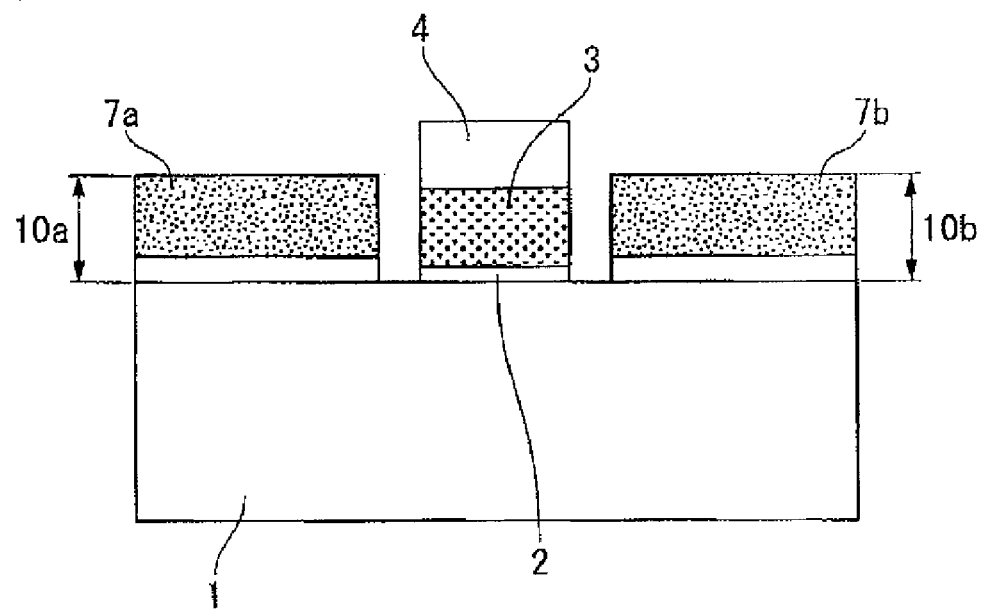
FIG. 13 is a vertical cross-sectional view of a step sequence in a manufacturing method of a semiconductor device according to a fifth embodiment, and illustrates a state before formation of first, third, and fourth diffusion layer regions.
Figure 14:
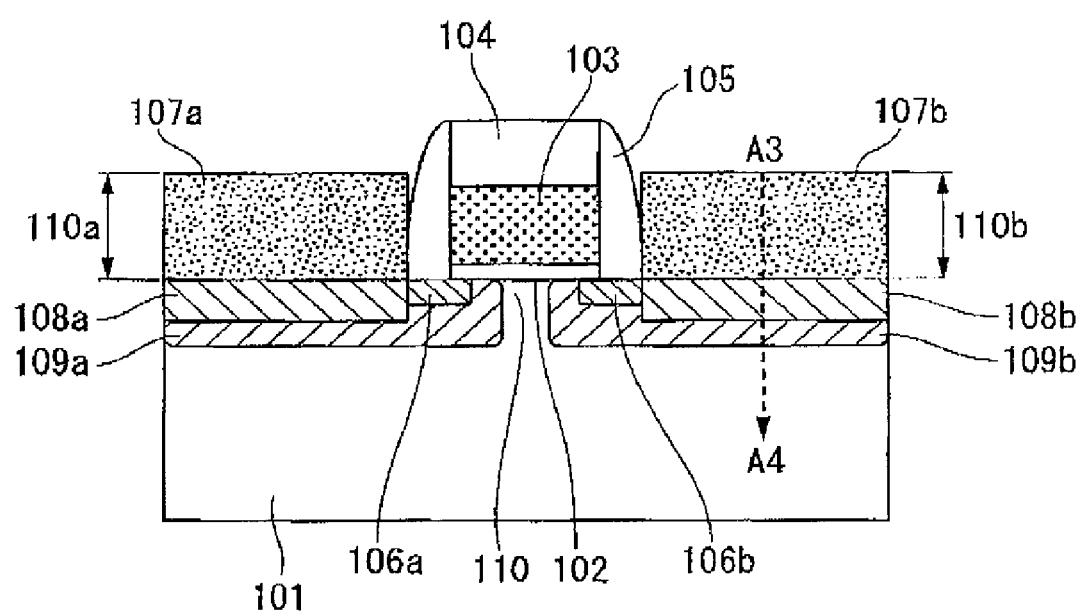
FIG. 14 is a vertical cross-sectional view of a semiconductor device of related art.
Figure 15:
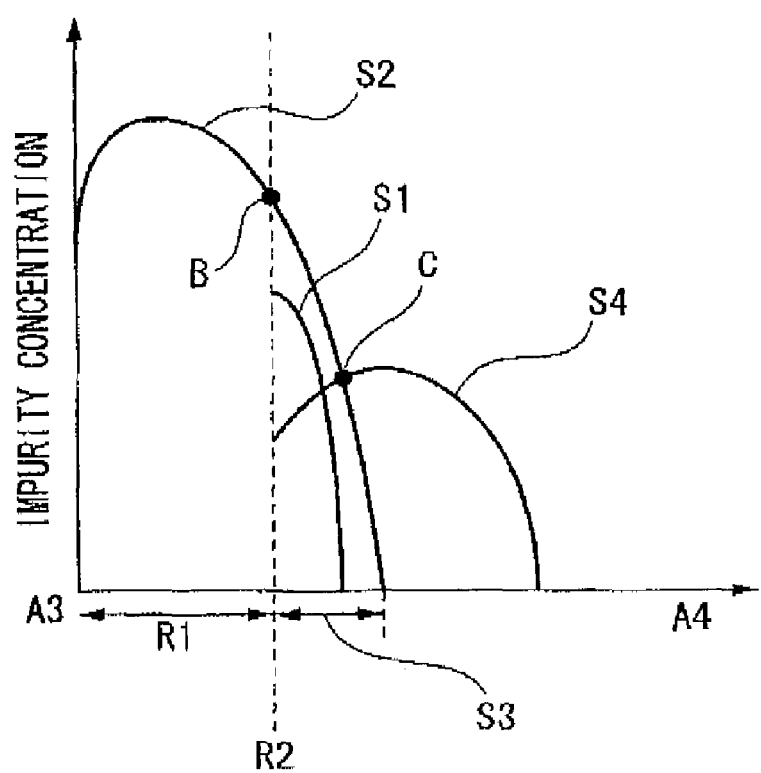
FIG. 15 is a schematic view of an impurity concentration profile taken along a line A3-A4 in FIG. 14 in the semiconductor device of related art.

Steps of manufacturing the semiconductor device of the fifth embodiment modify the steps of manufacturing the semiconductor device of the fourth embodiment as follows. {Step 3} is omitted, while {Step 6} is not omitted and is performed as in the first embodiment. Also, when performing {Step 8} (FIG. 13), the fourth diffusion layer regions 9a and 9b are formed near both sides of the gate electrode 3 by, for example, boron ion implantation. Thus the semiconductor device of the fit embodiment can be manufactured.

Impurities are also introduced by ion implantation into top faces of the silicon selective growth layers 10a and 10b, these regions overlapping with the second diffusion layer regions 7a and 7b; in addition, the impurity concentration of the fourth diffusion layer that generally functions as a halo is comparatively lower than the impurity concentration of the second diffusion layer regions 7a and 7b which are n+ regions. Therefore, to simplify explanation, only regions near both sides of the gate electrode 3 are made into fourth diffusion layer regions 9a and 9b.

In the fifth embodiment, the fourth diffusion layer regions 9a and 9b are fabricated only near both sides of the gate electrode 3. Therefore, even if the end of the impurity distribution of the second diffusion layer regions 7a and 7b is formed deeper than the silicon selective growth layers 10a and 10b by thermal processing and the like, the junction capacity does not increase. As a result, signal delay in the circuit can be kept low.

Specific embodiments of the semiconductor device of the invention and a manufacturing method thereof have been explained. In these embodiments, the materials for constituting the semiconductor device, their thicknesses, and formation methods are merely examples, it being possible to make modifications without deviating from the scope of the invention. For example in the third and fourth embodiments, the second diffusion layer regions can be provided as in the first embodiment. While in each of the embodiments described above, the transistor that constitutes the semiconductor device is an n-channel type, a p-channel type transistor can be used instead.

INDUSTRIAL APPLICABILITY

The present invention can be applied in, for example, any semiconductor device that includes a transistor.

What is claimed is:

1. A semiconductor device manufacturing method comprising:
    forming side walls on side faces of a gate electrode provided with a gate insulation film and an upper gate insulation film, said gate electrode formed on a semiconductor substrate;
    forming step-like silicon selective growth layers on said semiconductor substrate at both sides of said gate electrode such that said silicon selective growth layers are adjacent to said side walls;
    removing said side walls completely; and
    forming first diffusion layer regions at a face of said semiconductor substrate corresponding to positions of said removed side walls, second diffusion layer regions having a same conductive type as said first diffusion layer regions near top faces of said silicon selective growth layers, and third diffusion layer regions having the same conductive type as said first diffusion layer regions at side faces of said silicon selective growth layers, simultaneously.

2. The semiconductor device manufacturing method according to claim 1, further comprising forming fourth diffusion layer regions around said first diffusion layer regions, said fourth diffusion layer regions of an opposite conductive type to said first, second and third diffusion layer regions.

3. A semiconductor device manufacturing method comprising:
    forming first diffusion layer regions at a semiconductor substrate on which a gate electrode provided with a gate insulation film and an upper gate insulation film are formed, in regions corresponding to both sides of said gate electrode;
    forming side walls on side faces of said gate electrode;
    forming step-like silicon selective growth layers on said semiconductor substrate at both sides of said gate electrode such that said silicon selective growth layers are adjacent to said side walls;
    removing at let part of said side walls to form gap sections along side faces of said silicon selective growth layers; and
    forming second diffusion layer regions having a same conductive type as said first diffusion layer regions near top faces of said silicon selective growth layers, and third diffusion layer regions having the same conductive type as said first diffusion layer regions at side faces of said silicon selective growth layers, simultaneously.

4. The semiconductor device manufacturing method according to claim 3, further comprising forming fourth diffusion layer regions around said first diffusion layer regions, said fourth diffusion layer regions of an opposite conductive type to said first, second and third diffusion layer regions.

5. A semiconductor device manufacturing method comprising:
    forming side walls on side faces of a gate electrode provided with a gate insulation film and an upper gate insulation films said gate electrode formed on a semiconductor substrate;
    forming step-like silicon selective growth layers on said semiconductor substrate at both sides of said gate electrode such that said silicon selective growth layers are adjacent to said side walls;
    removing at least part of said side walls to form gap sections along side faces of said silicon selective growth layers;
    forming a first diffusion layer region only below said side walls via said gap sections; and
    forming second diffusion layer regions having a same conductive type as said first diffusion layer regions near top faces of said silicon selective growth layers, and third diffusion layer regions having the same conductive type as said first diffusion layer regions at side faces of said silicon selective growth layers, simultaneously.

6. The semiconductor device manufacturing method according to claim 5, further comprising forming fourth diffusion layer regions around said first diffusion layer regions, said fourth diffusion layer regions of an opposite conductive type to said first, second and third diffusion layer regions.

7. A semiconductor device manufacturing method comprising:
    forming first diffusion layer regions at a semiconductor substrate on which a gate electrode provided with a gate insulation film and an upper gate insulation film are formed, in regions corresponding to both sides of said gate electrode;
    forming side walls on side faces of said gate electrode;
    forming step-like silicon selective growth layers on said semiconductor substrate at both sides of said gate electrode such that said silicon selective growth layers are adjacent to said side walls;
    forming second diffusion layer regions having a same conductive type as said first diffusion layer regions at top faces of said silicon selective growth layers, such that at least peak positions of impurity concentrations of said second diffusion layer regions are shallower than bottoms of said silicon selective growth layers;
    removing at least part of said side walls to form gap sections along side faces of said silicon selective growth layers; and
    forming third diffusion layer regions having a same conductive type as said first and second diffusion layer regions near side faces of said silicon selective growth layers, via said gap sections.

8. The semiconductor device manufacturing method according to claim 7, further comprising forming fourth diffusion layer regions around said first diffusion layer regions, said fourth diffusion layer regions of an opposite conductive type to said first, second and third diffusion layer regions.

9. The semiconductor device manufacturing method according to claim 7, wherein plasma doping is used when forming said third diffusion layer regions.

10. The semiconductor device manufacturing method according to claim 7, wherein rotation-tilt ion implantation is used when forming said third diffusion layer regions.

11. A semiconductor device manufacturing method comprising:
  forming side walls on side faces of a gate electrode provided with a gate insulation film and an upper gate insulation film, said gate electrode formed on a semiconductor substrate;
  forming step-like silicon selective growth layers on said semiconductor substrate at both sides of said gate electrode such that silicon selective growth layers are adjacent to said side walls;
  forming second diffusion layer regions at a top face of said silicon selective growth layers, such that at least peak positions of impurity concentration of said second diffusion layer regions are shallower than bottoms of said silicon selective growth layers;
  removing said side walls completely;
  forming fourth diffusion layer regions having an opposite conductive type to said second diffusion layer regions, at a face of said semiconductor substrate corresponding to positions of said removed side walls,
  forming first diffusion layer regions having a same conductive type as said second diffusion layer regions at a shallow depth than said fourth diffusion layer regions at the face of said semiconductor substrate corresponding to the positions of said removed side walls, and third diffusion layer regions having the same conductive type as said second diffusion layer regions at side faces of said silicon selective growth layers, simultaneously.

12. A semiconductor device comprising:
  a semiconductor substrate;
  a pair of first diffusion layer regions provided near a top face of said semiconductor substrate;
  a channel region provided between said first diffusion layer regions of said semiconductor substrate;
  a gate insulation film provided on said channel region and on said semiconductor substrate such as to overlap with at least part of said first diffusion layer regions;
  a gate electrode provided on said insulation film;
  a pair of silicon selective growth layers provided on said semiconductor substrate at both sides of said gate electrode, each of said pair of silicon selective growth layers overlapping with at least part of said first diffusion layer regions, and being provided at a distance from said gate electrode;
  second diffusion layer regions provided in each of said silicon selective growth layers, peak positions of impurity concentration of said second diffusion layer regions being shallower than bottoms of said silicon selective growth layers; and
  third diffusion layer regions provided near side faces of said silicon selective growth layers, and electrically connecting said first diffusion layer regions to said second diffusion layer regions.

13. The semiconductor device according to claim 12, wherein positions of entire said second diffusion layer regions are shallower than bottoms of said silicon selective growth layers.

14. The semiconductor device according to claim 12, further comprising fourth diffusion layer regions around said first diffusion layer regions, said fourth diffusion layer regions including an impurity of an opposite conductive type to said first diffusion layer regions.

* * * * *